(12) United States Patent
Hwang

(10) Patent No.: US 9,263,615 B2
(45) Date of Patent: Feb. 16, 2016

(54) NON-POWER COOLING TYPE SOLAR PANEL

(75) Inventor: Eui Young Hwang, Pyeongtaek-si (KR)

(73) Assignee: ENERGYN INC, Incheon (KR)

( * ) Notice: Subject to any disclaimer, the term of this patent is extended or adjusted under 35 U.S.C. 154(b) by 0 days.

(21) Appl. No.: 14/112,890

(22) PCT Filed: Apr. 17, 2012

(86) PCT No.: PCT/KR2012/002889
§ 371 (c)(1),
(2), (4) Date: Oct. 18, 2013

(87) PCT Pub. No.: WO2012/144777
PCT Pub. Date: Oct. 26, 2012

(65) Prior Publication Data
US 2014/0041710 A1  Feb. 13, 2014

(30) Foreign Application Priority Data

Apr. 21, 2011  (KR) .................. 10-2011-0037060

(51) Int. Cl.
H01L 31/052  (2014.01)

(52) U.S. Cl.
CPC ..... *H01L 31/0521* (2013.01); *H01L 2924/0002* (2013.01); *Y02E 10/50* (2013.01)

(58) Field of Classification Search
CPC ...... H01L 31/0521; H01L 31/05; Y02E 10/50
USPC ............ 136/200–293; 361/700, 691
See application file for complete search history.

(56) References Cited

U.S. PATENT DOCUMENTS

| | | | | |
|---|---|---|---|---|
| 4,193,081 A | * | 3/1980 | Kaplow et al. | 136/246 |
| 4,361,717 A | * | 11/1982 | Gilmore et al. | 136/246 |
| 5,099,311 A | * | 3/1992 | Bonde et al. | 165/80.4 |
| 5,239,200 A | * | 8/1993 | Messina et al. | 257/714 |
| 6,337,794 B1 | * | 1/2002 | Agonafer et al. | 361/690 |
| 7,820,906 B2 | * | 10/2010 | Johnson | F24J 2/1047 136/243 |
| 2002/0075652 A1 | * | 6/2002 | Berchowitz | F28D 15/0266 361/700 |
| 2010/0275973 A1 | * | 11/2010 | Carnation | 136/248 |
| 2012/0087088 A1 | * | 4/2012 | Killion | F28D 15/0266 361/697 |

FOREIGN PATENT DOCUMENTS

| | | |
|---|---|---|
| JP | 09-266324 A | 10/1997 |
| JP | 2000-114574 A | 4/2000 |
| JP | 2001-127328 A | 5/2001 |
| KR | 10-2010-0073083 A | 7/2010 |

* cited by examiner

*Primary Examiner* — Jeffrey T Barton
*Assistant Examiner* — Michael Y Sun
(74) *Attorney, Agent, or Firm* — Novick, Kim & Lee, PLLC; Jae Youn Kim

(57) ABSTRACT

The present invention relates to a solar panel that is cooled without using power, and more particularly, to a solar panel which is cooled without using power and which is naturally cooled by means of ascending air heated in a passage provided in a cooling plate so as to maintain the temperature of the solar panel suitable for the efficient generation of power without requiring a separate power source. For this purpose, the solar panel of the present invention includes: a cell panel including solar cells for converting solar energy into electric energy; and a cooling plate directly or indirectly contacting the back surface of the cell panel so as to transfer heat, the cooling plate having a cooling-air passage which is formed so as to extend vertically within the cooling plate, and the upper and lower ends of which are in contact with the outside air.

7 Claims, 5 Drawing Sheets

NON-POWER COOLING TYPE SOLAR PANEL

TECHNICAL FIELD

The present invention relates to a solar panel, and more particularly to a non-power cooling type solar panel capable of achieving efficient natural cooling without consumption of power, thereby achieving efficient generation of power even under high-temperature conditions.

BACKGROUND ART

In accordance with increased interest in alternative energy and clean energy, demand for photovoltaic power generation to generate electric power by utilizing sunlight as a renewable energy source is greatly increasing.

In general, a photovoltaic power generation apparatus directly converts sunlight into electric energy to be used in the form of electric power by including a solar panel integrated with a plurality of solar cells to convert sunlight into electricity, a battery to accumulate the generated electricity, and a power transformer to transform current/voltage of the accumulated power.

In such a photovoltaic power generation apparatus, the power generation efficiency of the solar panel is most important factor. The power generation efficiency of the solar panel is proportional to the amount of sunlight incident upon the solar panel. That is, efficient power generation may be achieved during long, sunny days, and the solar panel is perpendicular to the incidence direction of sunlight. Another important factor having great influence on the power generation efficiency of the solar panel is temperature. As ambient temperature increases, the power generation efficiency of the solar panel is greatly decreased.

For this reason, in the summer season exhibiting superior conditions in terms of sunshine amount and incidence angle of sunlight, degradation in power generation efficiency occurs and, as such, it may be difficult to achieve sufficient power generation. This also hinders effective utilization of photovoltaic power generation in areas superior in terms of other conditions, such as equatorial areas and desert areas.

In order to avoid degradation in power generation efficiency under the above-mentioned high-temperature conditions, it is necessary to cool the solar panel. However, conventional cooling devices consume energy in order to perform driving for cooling and, as such, there is a problem in that increase in power generation efficiency is hindered.

DISCLOSURE

Technical Problem

Therefore, the present invention has been made in view of the above problems, and it is an object of the present invention to provide a non-power cooling type solar panel capable of achieving natural cooling through rising of air heated in channels within a cooling panel, thereby maintaining the temperature of the solar panel at a predetermined temperature, at which efficient power generation is possible without consumption of power.

Technical Solution

In accordance with an aspect of the present invention, the above and other objects can be accomplished by the provision of a non-power cooling type solar panel including a cell panel provided with solar cells for converting sunlight into electric energy, and a cooling panel installed to be in direct or indirect contact with a back surface of the cell panel, for transfer of heat, the cooling panel being provided with a cooling air channel formed in the cooling panel, to be vertically elongated, while communicating with ambient air at upper and lower ends of the cooling air channel.

The cooling panel may have a cross-sectional shape uniform in a longitudinal direction, to enable extrusion molding of the cooling panel. The cooling air channel of the cooling panel may be provided with barrier walls to form a plurality of partitioned channels.

The cooling panel may be provided with a first refrigerant receiving chamber and a second refrigerant receiving chamber, which are partitioned from the cooling air channel while receiving refrigerant. The first refrigerant receiving chamber and the second refrigerant receiving chamber may be connected via a first tube for movement of evaporated refrigerant and a second tube for movement of condensed refrigerant such that heat of a high temperature region in the cooling panel is transferred to a low temperature region in the cooling panel in accordance with circulation and phase change of the refrigerant between the first refrigerant receiving chamber and the second refrigerant receiving chamber. In this case, the refrigerant may be a fluid having a lower boiling point than water. The first refrigerant receiving chamber may be provided at a side of the cooling panel directed to the cell panel, and the second refrigerant receiving chamber is provided at an opposite side of the cooling panel under a condition that the cooling air channel is interposed between the first refrigerant receiving chamber and the second refrigerant receiving chamber.

Heat dissipation fins are formed in the cooling air channel of the cooling panel. The cooling panel may include a body formed with a plurality of heat dissipation fins, and a cover coupled to the body such that the cover contacts outer ends of the heat dissipation fins. Alternatively, the cooling panel may include a panel-shaped body, and a cover having a channel-shaped cross-section to form the cooling air channel.

Advantageous Effects

In accordance with the present invention, there are effects as follows.

(1) Continuous air flow is formed in accordance with transfer of heat in the cooling air channels formed in the cooling panel and, as such, heat of the cell panel is rapidly dissipated through the cooling panel without using a separate power source. Accordingly, it is possible to maintain the cell panel at low temperature without consumption of power for cooling, thereby achieving an enhancement in the power generation efficiency of the solar panel.

(2) Heat of a high temperature region is rapidly transferred to a low temperature region in accordance with phase change of refrigerant circulating between the first and second refrigerant receiving chambers formed in the cooling panel and, as such, heat of the cell panel is uniformly and rapidly transferred to the cooling panel without being concentrated on a portion of the cooling panel. Accordingly, cooling of the cell panel by the cooling panel is further promoted and, as such, it may be possible to further enhance the power generation efficiency of the solar panel.

MODE FOR INVENTION

Figure 1:
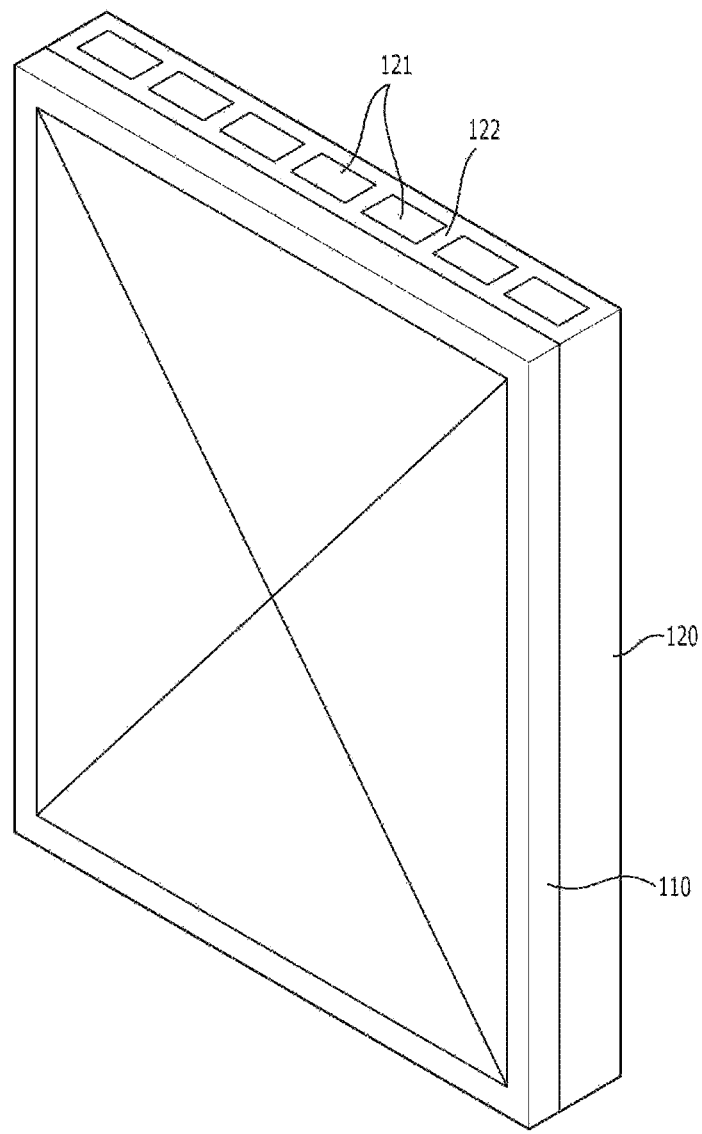
FIG. 1 is a perspective view illustrating a first embodiment of a non-power cooling type solar panel according to the present invention.

The above and other objects, features and other advantages of the present invention will be more clearly understood from the following detailed description taken in conjunction with the accompanying drawings.

For the embodiments according to the concept of the present invention disclosed herein, specific structural or functional descriptions are exemplary to merely describe the embodiments of the present invention, and the embodiments of the present invention can be implemented in various forms and should not be interpreted as being limited to the embodiments described in the present specification.

As various modifications can be made and diverse embodiments are applicable to the embodiments according to the concept of the present invention, specific embodiments will be illustrated with reference to the accompanying drawings and described in detail herein. However, these specific embodiments should not be construed as limiting the embodiments according to the concept of the present invention, but should be construed as extending to all modifications, equivalents, and substitutes included in the concept and technological scope of the invention.

Terms including ordinal numbers such as first, second, etc. can be used to describe various elements, but the elements should not be limited by these terms. The terms are used merely for the purpose of distinguishing one element from another element. For example, a first element may be renamed second element and, similarly, a second element may be renamed first element without departing from the scope of right of the invention.

In case where an element is "connected" or "linked" to the other element, it should be understood that the element may be directly connected or linked to the other element, or another element may be present therebetween. On the contrary, in case where an element is "directly connected" or "directly linked" to another element, it should be understood that no other element is present therebetween. Other expressions describing a relation between constituent elements, such as "between" and "immediately between", or "adjacent to" and "directly adjacent to", and the like, should be construed in a similar manner.

It should be noted that the terms used herein are merely used to describe a specific embodiment, not to limit the present invention. Incidentally, unless clearly used otherwise, singular expressions include a plural meaning. In this application, the term "comprising," "including," or the like, intend to express the existence of the characteristic, the numeral, the step, the operation, the element, the part, or the combination thereof, and does not exclude another characteristic, numeral, step, operation, element, part, or any combination thereof, or any addition thereto.

Unless defined otherwise, the terms used herein including technological or scientific terms have the same meaning that is generally understood by those of ordinary skill in the art to which the invention pertains. The terms used herein shall be interpreted not only based on the definition of any dictionary but also the meaning that is used in the field to which the invention pertains. In addition, unless clearly defined, the terms used herein shall not be interpreted too ideally or formally.

Hereinafter, the present invention will be described in detail by describing a preferred embodiment of the present invention with reference to the accompanying drawing. The same reference numerals in the drawings denote the same elements.

Figure 2:
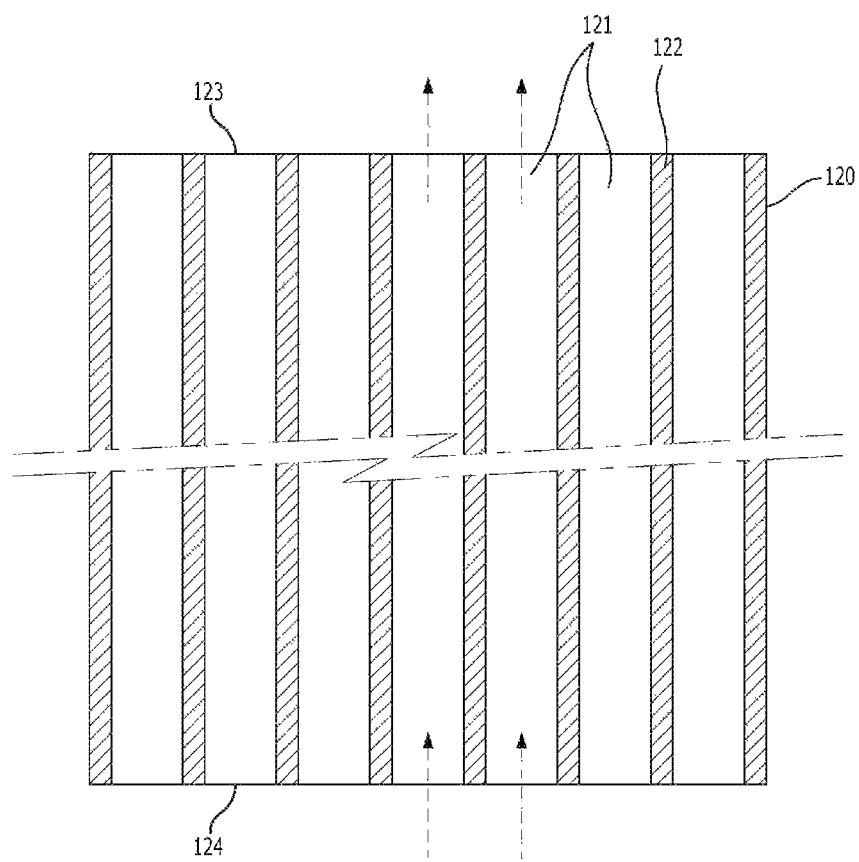
FIG. 2 is a sectional view illustrating an inner configuration of a cooling panel in the solar panel illustrated in FIG. 1.

FIG. 1 is a perspective view illustrating a first embodiment of a non-power cooling type solar panel according to the present invention. FIG. 2 is a sectional view illustrating an inner configuration of a cooling panel in the solar panel illustrated in FIG. 1.

As illustrated in FIGS. 1 and 2, the solar panel of the present invention has a structure in which a cell panel 110 and a cooling panel 120 are coupled to be in direct or indirect contact with each other so as to enable heat transfer therebetween. Here, "indirect contact" collectively includes all contact enabling heat transfer via a heat transfer member such as a metal plate or a heat transfer medium such as thermal conductive grease.

The cell panel 110 is a panel upon which a plurality of solar cells is arranged, as in a general solar panel. Generally, the solar cells have the form of thin film modules connected in series/parallel in order to generate voltage and current desired by the user. The cell panel 110 includes a frame formed by a glass substrate in order to accommodate the solar cell modules, for protection of the solar cell modules.

The cooling panel 120 is installed in contact with a back surface of the cell panel 110. Preferably, the cooling panel 120 is directly coupled to the cell panel 110 in order to achieve an enhancement in mechanical strength as well as cooling.

The cooling panel 120 has a panel structure having a size corresponding to the cell panel 110. Cooling air channels 121 are formed in the cooling panel 120, to extend vertically. Each cooling air channel 121 is opened at upper and lower ends thereof, to upwardly discharge ambient air after receiving the air through the lower end, namely, to function like a chimney. That is, each cooling air channel 121 is provided at the lower end thereof with an inlet 124 while being provided at the upper end thereof with an outlet 123. The cooling panel 120 may have a cooling air channel 121 having the form of a single passage. However, the cooling panel 120 preferably has vertically-elongated cooling air channels 121 divided by partition walls 122 formed to extend vertically. The vertically elongated channel structure is effective in that natural upward air flow is formed by virtue of chimney effects and, as such, an enhancement in cooling effects is obtained.

The cooling panel 120 is preferably made of a material that is as light as possible while exhibiting thermal conductivity, for example, an aluminum material. In addition, the cooling panel 120 preferably has a cross-sectional shape constant in a longitudinal direction, for easy mass production through extrusion molding.

The solar panel of the present invention configured as described above is installed such that the cell panel 110 is directed to the sun, and the cooling panel 120 is directed to oppose the sun. The cell panel 110 outwardly dissipates, through the cooling panel 120, heat of the cell panel 110 heated by sunlight and, as such, cooling of the cell panel 110 is achieved.

That is, when heat of the cell panel 110 is transferred to the cooling panel 120, air in the cooling air channels 121 is upwardly moved in accordance with heating thereof. The air is outwardly discharged through the outlets 123 at the upper end of the cooling panel 120. As the heated air is discharged through the outlets 123, ambient air is introduced into the inlets 124 at the lower end of the cooling panel 120 and, as such, continuous upward flow of air is formed in each cooling air channel 121.

Accordingly, heat absorbed by the cooling panel 120 is outwardly rapidly dissipated by ambient air discharged from the cooling air channels 121 after being introduced into the cooling air channels 121 and, as such, efficient cooling of the cell panel 110 may be achieved. Since no power is used for cooling in the above procedure, it may be possible to save energy.

Meanwhile, dissipation of heat may also be carried out through outer surfaces of the cooling panel 120 in addition to the cooling air channels 121. In order to promote dissipation of heat through the outer surfaces, although not shown, a plurality of heat dissipation pins may be provided at the outer surfaces of the cooling panel 120, to achieve increase in heat exchange area.

Figure 3:
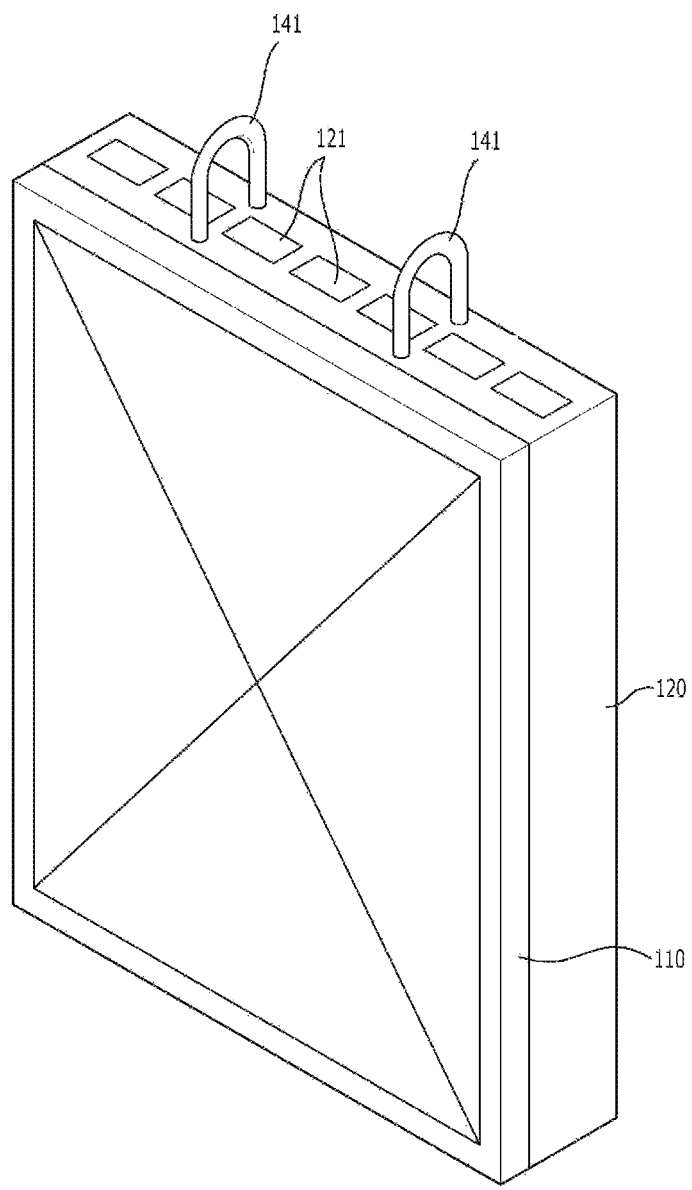
FIG. 3 is a perspective view illustrating a second embodiment of the solar panel according to the present invention.
Figure 4:
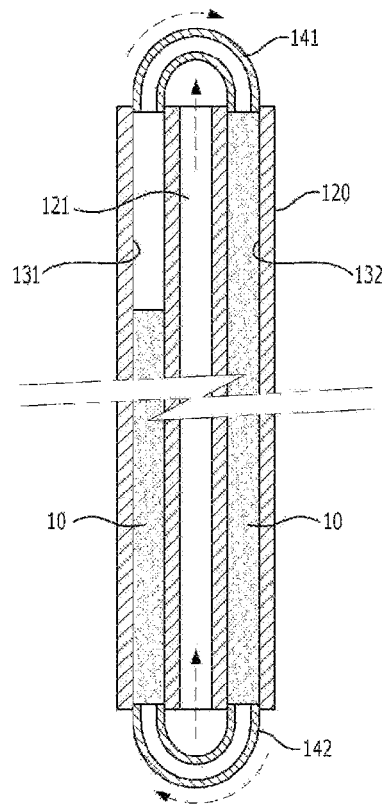
FIG. 4 is a sectional view illustrating an inner configuration of a cooling panel in the second embodiment.

FIG. 3 is a perspective view illustrating a second embodiment of the solar panel according to the present invention. FIG. 4 is a sectional view illustrating an inner configuration of a cooling panel in the second embodiment.

Similarly to the first embodiment, the illustrated solar panel of the second embodiment includes a cell panel 110 and cooling panel 120, which are coupled to be in direct or indirect contact with each other so as to enable heat transfer therebetween. A plurality of cooling air channels 121 partitioned by partition walls 122 is formed in the cooling panel 120, to extend vertically.

In addition, a first refrigerant receiving chamber 131 and a second refrigerant receiving chamber 132 are provided at the cooling panel 120. The first and second refrigerant receiving chambers 131 and 132 are partitioned from each other while being partitioned from the cooling air channels 121. The first and second refrigerant receiving chambers 131 and 132 are connected via a first tube 141 and a second tube 142 and, as such, inner spaces thereof communicate with each other.

One of the first and second refrigerant receiving chambers 131 and 132 is formed at a portion of the cooling panel 120 exhibiting relatively high temperature, whereas the other of the first and second refrigerant receiving chambers 131 and 132 is formed at a portion of the cooling panel 120 exhibiting relatively low temperature. The first and second refrigerant receiving chambers 131 and 132 are preferably disposed at opposite sides under the condition that the cooling air channels 121 are interposed between the first and second refrigerant receiving chambers 131 and 132. In the illustrated embodiment, the first refrigerant receiving chamber 131 is illustrated as being formed at a portion of the cooling panel 120 directed to the cell panel 110 exhibiting relatively high temperature due to heating thereof by sunlight, whereas the second refrigerant receiving chamber 132 is illustrated as being formed at a portion of the cooling panel 120 disposed opposite to the cell panel 110 while exhibiting relatively low temperature.

As refrigerant received in the first and second refrigerant receiving chambers 131 and 132, a various kinds of fluids capable of transferring heat through utilization of latent heat according to phase change may be used. A fluid having a low boiling point than water is preferable. The inner spaces of the first and second refrigerant receiving chambers 131 and 132 are preferably vacuum-treated so as to be maintained at an air pressure that is as low as possible. The inner spaces of the first and second refrigerant receiving chambers 131 and 132 are preferably configured to vary the boiling point of the refrigerant through adjustment of the internal air pressure of the inner spaces in accordance with the temperature condition at the place where the solar panel is installed. To this end, although not shown, tube connecting means is provided at the first and second refrigerant receiving chambers 131 and 132 in order to connect a pump for adjustment of air pressure to the first and second refrigerant receiving chambers. The connecting means may be separately provided. Alternatively, ports provided for injection of refrigerant may also be used as the connecting means.

The first tube 141 functions to move refrigerant evaporated after being heated in a high temperature region to a low temperature region. In the illustrated embodiment, the first tube 141 is connected to upper ends of the first and second refrigerant receiving chambers 131 and 132 in order to move refrigerant evaporated in the first refrigerant receiving chamber 131 maintained at relatively high temperature to the second refrigerant receiving chamber 132 maintained at relatively low temperature.

The second tube 142 functions to move refrigerant condensed in the low temperature region to the high temperature region. In the illustrated embodiment, the first tube 141 is connected to lower ends of the first and second refrigerant receiving chambers 131 and 132 in order to move refrigerant condensed in the second refrigerant receiving chamber 132 maintained at relatively low temperature to the first refrigerant receiving chamber 131 maintained at relatively high temperature.

In the solar panel of the second embodiment configured as described above, heat is dissipated by ambient air flowing through the cooling air channels 121, thereby cooling the cell panel 110, as in the above-described first embodiment. At the same time, heat is transferred from the high temperature region to the low temperature region in the cooling panel 120 in accordance with circulation and phase change of refrigerant between the first and second refrigerant receiving chambers 131 and 132 and, as such, temperature deviations of the cooling panel 120 are reduced.

That is, in the first refrigerant receiving chamber 131, heat transferred from the cell panel 110 is absorbed by refrigerant. On the other hand, heat of refrigerant in the second refrigerant receiving chamber 132 is transferred to the cooling air channels 121 while being outwardly dissipated. The refrigerant heated in the first refrigerant receiving chamber 131 is evaporated, and is then moved to the second refrigerant receiving chamber 132 via the first tube 141. The refrigerant then discharges heat while being condensed. Liquid refrigerant in the second refrigerant receiving chamber 132 is moved to the first refrigerant receiving chamber 131 via the second tube 142 in accordance with a reduction in the internal pressure of the first refrigerant receiving chamber 131 caused by evaporation of the refrigerant.

Since refrigerant circulates between the first and second refrigerant receiving chambers 131 and 132 while being changed in phase, heat of the cell panel 110 is uniformly and rapidly transferred to the entirety of the cooling panel 120. Accordingly, cooling of the cell panel 110 by the cooling panel is more efficiently achieved.

Meanwhile, the cooling air channels 121 of the cooling panel 120 in the solar panel in each of the above-described embodiments may have various structures, and may be formed, using various methods. Examples of the cooling air channels 121 are illustrated in FIGS. 5 to 9.

Figure 5:
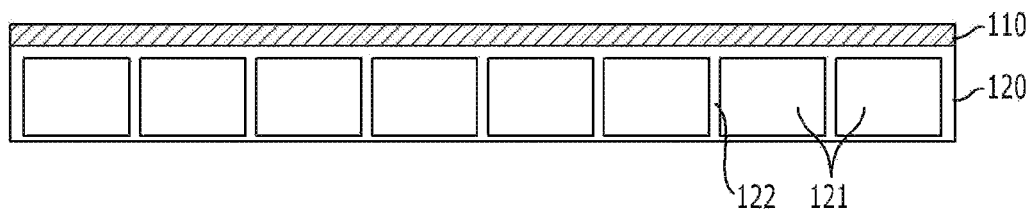
FIGS. 5 to 9 are sectional views illustrating various structures of the cooling panel in the solar panel according to the first embodiment.
Figure 6:
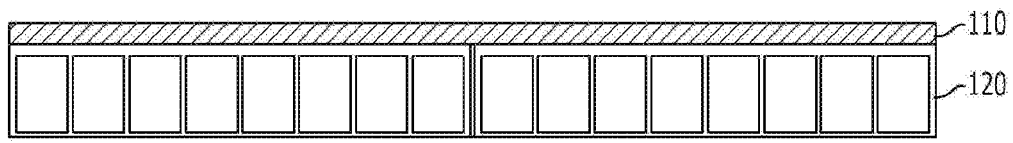
Figure 7:
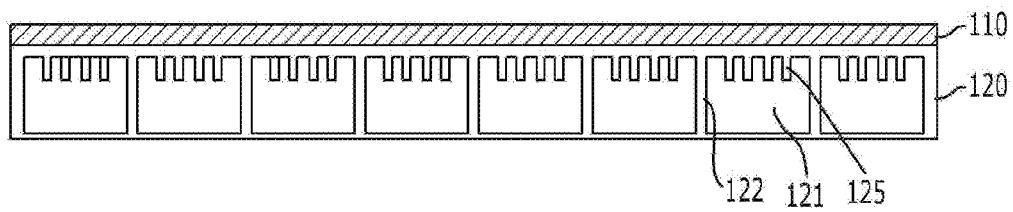

That is, as illustrated in FIG. 5, the cooling panel 120 may have the form of a single member extruded to be formed with cooling air channels 121 having a quadrangle shape (similar to the embodiment of FIG. 1). When the solar panel has a large area, a plurality of cooling panels 120 may be installed at the cell panel 110, as illustrated in FIG. 6. Alternatively, as illustrated in FIG. 7, the cooling panel 120 may have the form of a single extruded member, as in the embodiment illustrated in FIG. 5, and may be provided with heat dissipation fins 125 protruding in each cooling air channel 121 while being spaced apart from one another by a certain distance.

Figure 8:
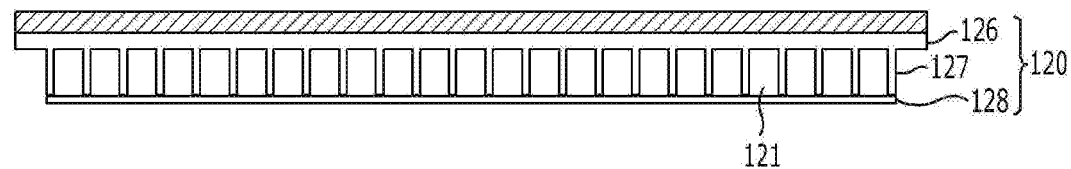
Figure 9:
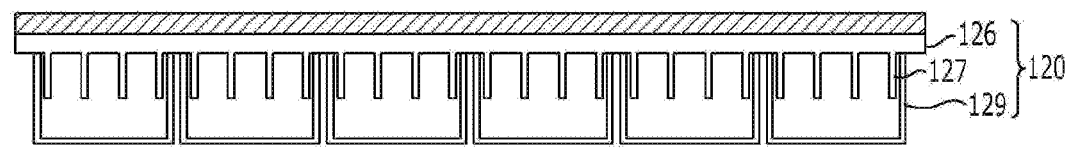

In addition, as illustrated in FIG. 8, the cooling panel 120 may have a structure including a body 126 having the form of a general heat sink formed with a plurality of heat dissipation fins 127, and a plate-shaped cover 128 coupled to the body 126 such that the cover 128 contacts outer ends of the heat dissipation fins 127, to form cooling air channels 121 each defined between adjacent ones of the heat dissipation fins 127. Alternatively, as illustrated in FIG. 9, channel type covers 129 having a U-shaped cross-section may be coupled to the body 126, to form a cooling air channel 121 in each cover 129. In this case, the body 129 may have the form of a heat sink provided with a plurality of heat dissipation fins 127.

As described above, in accordance with the present invention, the cooling panel 120 may have various structures to form cooling air channels 121 elongated vertically for promoted cooling obtained by chimney effects. The cross-section of the cooling air channels 121 may have various shapes such as polygonal, circular, oval, and curved shapes, in addition to the illustrated quadrangle shape.

Although not shown, the cooling panel 120 in the embodiment illustrated in FIGS. 5 to 9 may also have a structure provided with a first refrigerant receiving chamber 131 and a second refrigerant receiving chamber 132 connected by tubes for circulation of refrigerant, as in the second embodiment.

(Description of Reference Numerals)

| | |
|---|---|
| 10: refrigerant | 110: cell panel |
| 120: cooling panel | 121: cooling air channel |
| 122: partition wall | 123: outlet |
| 124: inlet | 125: heat dissipation fin |
| 126: body | 127: heat dissipation fin |
| 128, 129: cover | 131: first refrigerant receiving chamber |
| 132: second refrigerant receiving chamber | 141: first tube |
| 142: second tube | |

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A non-power cooling type solar panel, comprising:
a cell panel including solar cells for converting sunlight into electric energy; and
a cooling panel installed to be in direct or indirect contact with a back surface of the cell panel, for transfer of heat, the cooling panel including a cooling air channel formed in the cooling panel, to be vertically elongated, while communicating with ambient air at upper and lower ends of the cooling air channel,
wherein the cooling panel includes a first refrigerant receiving chamber and a second refrigerant receiving chamber, which are partitioned from the cooling air channel while receiving refrigerant,
wherein the first refrigerant receiving chamber and the second refrigerant receiving chamber are connected via a first tube for a flow of an evaporated refrigerant and a second tube for a flow of a condensed refrigerant such that heat of a high temperature region in the cooling panel is transferred to a low temperature region in the cooling panel in accordance with a circulation and phase change of the refrigerant between the first refrigerant receiving chamber and the second refrigerant receiving chamber, and
wherein the first refrigerant receiving chamber is located at a side of the cooling panel proximal to the cell panel, and the second refrigerant receiving chamber is located at another side of the cooling panel distal to the cell panel under a condition that the entirety of the cooling air channel is interposed between the first refrigerant receiving chamber and the second refrigerant receiving chamber.

2. The non-power cooling type solar panel according to claim 1, wherein the cooling panel has a cross-sectional shape uniform in a longitudinal direction, to enable extrusion molding of the cooling panel.

3. The non-power cooling type solar panel according to claim 1, wherein the cooling air channel of the cooling panel includes barrier walls to form a plurality of partitioned channels.

4. The non-power cooling type solar panel according to claim 1, wherein the refrigerant is a fluid having a lower boiling point than water.

5. The non-power cooling type solar panel according to claim 1, wherein heat dissipation fins are formed in the cooling air channel of the cooling panel.

6. The non-power cooling type solar panel according to claim 1, wherein the cooling panel comprises a body formed with a plurality of heat dissipation fins, and a cover coupled to the body such that the cover contacts outer ends of the heat dissipation fins.

7. The non-power cooling type solar panel according to claim 1, wherein the cooling panel comprises a panel-shaped body, and a cover having a channel-shaped cross-section to form the cooling air channel.

* * * * *